US010580878B1

United States Patent
Joshi et al.

(10) Patent No.: US 10,580,878 B1
(45) Date of Patent: Mar. 3, 2020

(54) SIC DEVICE WITH BURIED DOPED REGION

(71) Applicant: Infineon Technologies AG, Neubiberg (DE)

(72) Inventors: Ravi Keshav Joshi, Klagenfurt (AT); Rudolf Elpelt, Erlangen (DE); Romain Esteve, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/105,742

(22) Filed: Aug. 20, 2018

(51) Int. Cl.
| H01L 29/66 | (2006.01) |
| H01L 29/06 | (2006.01) |
| H01L 29/10 | (2006.01) |
| H01L 29/78 | (2006.01) |
| H01L 29/16 | (2006.01) |

(52) U.S. Cl.
CPC .... H01L 29/66068 (2013.01); H01L 29/0684 (2013.01); H01L 29/1033 (2013.01); H01L 29/1608 (2013.01); H01L 29/7813 (2013.01)

(58) Field of Classification Search
CPC .......... H01L 29/66068; H01L 29/7813; H01L 29/0684; H01L 29/1608; H01L 29/1033
See application file for complete search history.

(56) References Cited

U.S. PATENT DOCUMENTS

| 8,704,295 B1 | 4/2014 | Blanchard et al. | |
| 9,136,372 B2* | 9/2015 | Miyahara | H01L 29/4236 |
| 2007/0114602 A1* | 5/2007 | Saito | H01L 29/7813 257/330 |
| 2013/0137230 A1 | 5/2013 | Blank | |
| 2014/0145206 A1* | 5/2014 | Siemieniec | H01L 29/7808 257/77 |
| 2016/0172468 A1* | 6/2016 | Esteve | H01L 29/66734 438/270 |
| 2016/0190301 A1 | 6/2016 | Aichinger et al. | |
| 2018/0277637 A1 | 9/2018 | Meiser et al. | |

FOREIGN PATENT DOCUMENTS

| DE | 102010000531 A1 | 10/2010 |
| DE | 102013214196 A1 | 1/2014 |
| DE | 102014117556 A1 | 6/2016 |
| DE | 102014117780 A1 | 6/2016 |

(Continued)

*Primary Examiner* — Syed I Gheyas
(74) *Attorney, Agent, or Firm* — Murphy, Bilak & Homiller, PLLC

(57) ABSTRACT

A SiC device with a doped buried region is provided. The doped buried region may be formed by: forming a first trench which extends into a first side of a SiC epitaxial layer of a first conductivity type, the first trench terminating at a first depth in the SiC epitaxial layer; at least partly filling the first trench with an epitaxial material of a second conductivity type opposite the first conductivity type; forming a second trench which extends into the first side of the SiC epitaxial layer so that the second trench overlaps the first trench, the second trench terminates at a second depth in the SiC epitaxial layer which is less than the first depth, and the epitaxial material in the first trench laterally extends below a bottom of the second trench; and forming a gate electrode in the second trench and electrically insulated from the SiC epitaxial layer.

20 Claims, 7 Drawing Sheets

(56) References Cited

FOREIGN PATENT DOCUMENTS

| | | |
|---|---|---|
| DE | 102015108440 B3 | 10/2016 |
| JP | 2004031385 A | 1/2004 |
| JP | 2013201400 A | 10/2013 |
| JP | 2016181618 A | 10/2016 |
| WO | 2010110246 A1 | 9/2010 |
| WO | 2016052203 A1 | 4/2016 |

* cited by examiner

SIC DEVICE WITH BURIED DOPED REGION

BACKGROUND

Silicon technology is limited for power transistor applications, and is being replaced by SiC and GaN technologies. However, SiC behaves differently than Si during device fabrication. Also, Si power transistors often include a separate p-n junction integrated with the transistor device. The integrated p-n junction is formed by dopant implantation and annealing, and serves as a freewheeling diode during operation. For example, buried p-type regions for an n-channel power transistor function as compensation regions which shape the electric field when the device is blocking.

Unlike Si technology, annealing in SiC activates dopant elements but does not cause meaningful diffusion deeper into the crystal structure. To create a buried dopant profile such as for an integrated p-n junction, implantation typically must be performed multiple times and with relatively high energy. Implant energies in the MeV range are needed to yield an acceptable dopant profile. For such high energies, a very thick oxide mask is usually required which further increases process cost. Also, often it is not possible to implant the required dose at the required position or depth due to geometrical or process constraints, adding to the process costs while also increasing the risk of creating a large amount of crystal defects in the SiC substrate. In addition, the annealing temperature for dopant activation is very high and seldom heals crystal defects generated during implantation. These defects remain in the device, and may cause hazardous effects such as bipolar degradation during device operation. Moreover, implantation may result in a tail which causes variation/mismatch between adjacent buried doped regions. The variation/mismatch may affect the gate oxide shielding ability of the buried doped regions since the distance between adjacent doped buried regions determines shielding effectiveness.

Thus, there is a need for an improved technique for forming a buried doped region of a SiC device.

SUMMARY

According to an embodiment of a method of forming a doped buried region of a SiC device, the method comprises: forming a first trench which extends into a first side of a SiC epitaxial layer of a first conductivity type, the first trench terminating at a first depth in the SiC epitaxial layer; at least partly filling the first trench with an epitaxial material of a second conductivity type opposite the first conductivity type; forming a second trench which extends into the first side of the SiC epitaxial layer so that the second trench overlaps the first trench, the second trench terminates at a second depth in the SiC epitaxial layer which is less than the first depth, and the epitaxial material in the first trench laterally extends below a bottom of the second trench; and forming a gate electrode in the second trench and electrically insulated from the SiC epitaxial layer.

The epitaxial material in the first trench may vertically extend along a lower part of a first sidewall of the second trench. A body region of the SiC device may adjoin the epitaxial material at the first sidewall of the second trench or may be formed in the epitaxial material. In addition or as an alternative, the body region may be connected to the epitaxial material via a contact region, such as e.g. a body contact region.

Separately or in combination, at least partly filling the first trench with the epitaxial material of the second conductivity type may comprise depositing a crystalline SiC overlayer of the second conductivity type on the first side of the SiC epitaxial layer and in the first trench. The crystalline SiC overlayer may further be planarized in a subsequent process step. By planarization, obsolete portions of the epitaxial material of the second conductivity type may be removed. Preparing a planarized surface may simplify subsequent process steps, such as, e.g., structuring or implantation by use of, e.g., photolithography, or may even be required for such a subsequent process step.

Separately or in combination; after planarizing the crystalline SiC overlayer and before forming the second trench, the method may further comprise: forming a body region of the second conductivity type in the planarized crystalline SiC overlayer; and forming a source region of the first conductivity type and a body contact region of the second conductivity type above the body region. Forming the body region, the source region and/or the body contact region may, in general, comprise implanting ions of at least one of the first conductivity type and the second conductivity type.

Separately or in combination, forming the second trench may comprise etching the second trench through the planarized crystalline SiC overlayer and into the SiC epitaxial layer.

Separately or in combination, the method may further comprise: before forming the first trench, forming a body region of the second conductivity type in the SiC epitaxial layer. If the body region is, for example, formed via implantation, forming the body region before forming the first trench may lead to reduced crystal damage from implantation in the epitaxial material in the first trench.

Separately or in combination, the method may further comprise: after forming the first trench and before forming the second trench, forming a source region of the first conductivity type and a body contact region of the second conductivity type above the body region.

Separately or in combination, after planarizing the crystalline SiC overlayer and before forming the second trench, the method may further comprise: forming a body region of the second conductivity type in the SiC epitaxial layer; and forming a source region of the first conductivity type and a body contact region of the second conductivity type above the body region. The body region may be formed near or at the first side of the SiC epitaxial layer, for example adjacent the first trench.

Separately or in combination, forming the first trench may comprise: etching the first trench to the first depth in the SiC epitaxial layer; filling a lower part of the first trench with an insulating material; widening an upper part of the first trench which is devoid of the insulating material, so that the first trench has a step transition between the upper part and the lower part; and after widening the upper part of the first trench, removing the insulating material from the lower part of the first trench. Widening the upper part may, for example, comprise an etch process.

Separately or in combination, at least partly filling the first trench with the epitaxial material of the second conductivity type may comprise: after removing the insulating material from the lower part of the first trench, depositing a crystalline SiC overlayer of the second conductivity type on the first side of the SiC epitaxial layer and in the lower part and the upper part of the first trench; and, optionally, planarizing the crystalline SiC overlayer, Separately or in combination, forming the second trench may comprise: etching the second trench to the second depth which is below the step transition of the first trench. In other words; the second depth may be larger than a depth of the upper part.

According to an embodiment of a SiC device, the SiC device comprises: a first trench extending into a first side of a SiC epitaxial layer of a first conductivity type, the first trench terminating at a first depth in the SiC epitaxial layer; an epitaxial material of a second conductivity type opposite the first conductivity type at least partly filling the first trench; a second trench extending into the first side of the SiC epitaxial layer, the second trench overlapping the first trench, the second trench terminating at a second depth in the SiC epitaxial layer which is less than the first depth, and the epitaxial material in the first trench laterally extending below a bottom of the second trench; and a gate electrode in the second trench and electrically insulated from the SiC epitaxial layer.

The epitaxial material in the first trench may vertically extend along a lower part of a first sidewall of the second trench. A body region of the SiC device may adjoin the epitaxial material at the first sidewall of the second trench or may be formed in the epitaxial material. In addition or as an alternative, the body region may be connected to the epitaxial material via a contact region, such as e.g. a body contact region.

Separately or in combination, the SiC device may further comprise; a body region adjacent the gate electrode; and a source region above the body region and adjacent the gate electrode, the body region and the source region being electrically insulated from the gate electrode.

Separately or in combination, the first trench may comprise a lower part and an upper part, the upper part may be wider than the lower part, the epitaxial material of the second conductivity type may be in the lower part and the upper part of the first trench, and the second trench may terminate in the SiC epitaxial layer below a step transition between the lower part and the upper part of the first trench. A step transition in the first trench may help to enhance the current spread in a drift zone of the manufactured SiC device.

Separately or in combination, the SiC device may comprise a plurality of first trenches, a plurality of second trenches and a plurality of body regions of the second conductivity type. The plurality of first trenches and the plurality of body regions may be arranged in rows of the first trenches, each row of the first trenches extending lengthwise in a first direction. The plurality of second trenches may be arranged in rows of the second trenches, each row of the second trenches extending lengthwise in a second direction transverse to the first direction. In this context, "transverse" may mean that the first direction and the second direction enclose an angle of at least 10° and at most 90°. The first direction and the second direction may both run along a lateral direction of the SiC device, i.e., perpendicular to a thickness of the SiC epitaxial layer. The first direction may be transverse, e.g. perpendicular, to the first depth of the first trenches. The second direction may be transverse, e.g. perpendicular, to the second depth of the second trenches. It may be possible for the first trenches and the body regions to have a same extent along the first and/or the second direction. For example, the first trenches and the body regions are arranged in a checkerboard-like structure.

Separately or in combination, in each row of the first trenches, the first trenches may be spaced apart from one another by one of the body regions. That is to say, the first trenches and the body regions in each row of the first trenches may be arranged alternatingly. The first trenches in adjacent rows of the first trenches may be offset from one another so that a first trench in one row of the first trenches adjoins at least part of a body region of an adjacent row of the first trenches. Further, the first trenches and the body regions, in particular the first trenches and the body regions of neighbouring rows of first trenches, may be arranged alternatingly along the second direction.

Separately or in combination, the epitaxial material of the second conductivity type at least partly filling the first trench may form part of a superjunction structure, e.g. of a compensation region of a superjunction structure. A superjunction structure in general may comprise compensation regions that are arranged in a drift zone of the SiC device, said compensation regions being laterally spaced by portions of the drift zone. Said portions of the drift zone being located between adjacent compensation regions may have a higher dopant concentration than other portions of the drift zone below the compensation regions. The compensation regions and the drift zone in a superjunction structure may be fully depletable, that is to say, the compensation regions and the drift zone may be aligned with each other with regards to their geometry and/or their doping concentrations to allow for an essentially complete ionisation of the doping atoms of the compensation regions and the drift zone, without reaching a critical field strength.

Separately or in combination, the SiC device may further comprise: a body region of the second conductivity type adjacent the gate electrode; a source region of the first conductivity type above the body region and adjacent the gate electrode; and a body contact region of the second conductivity type above the body region and adjacent the source region. The body region may extend through the body region to the epitaxial material of the second conductivity type.

Separately or in combination, the body contact region may comprise: a deeper, narrower part which contacts the epitaxial material of the second conductivity type; and an upper, wider part which extends over the body region.

Separately or in combination, the epitaxial material of the second conductivity type may comprise: an upper section with a lower doping concentration; and a lower section with a higher doping concentration.

According to an embodiment of a method of forming a doped buried region of a SiC device, the method comprises: forming a trench which extends into a first side of a SiC epitaxial layer of a first conductivity type; forming an epitaxial material of a second conductivity type opposite the first conductivity type in a bottom of the trench; forming an electrode structure in the trench, the electrode structure comprising a field electrode on and in electrical contact with the epitaxial material, and a gate electrode electrically insulated from the field electrode and the SiC epitaxial layer; and forming a body region adjacent the gate electrode, and a source region above the body region and adjacent the gate electrode, the body region and the source region being electrically insulated from the gate electrode. The gate electrode may be positioned above the field electrode or may laterally surround the field electrode.

Forming the epitaxial material of the second conductivity type in the bottom of the trench may comprise: depositing a crystalline SiC overlayer of the second conductivity type on the first side of the SiC epitaxial layer and in the bottom of the trench; and removing the crystalline SiC overlayer from the first side of the SiC epitaxial layer.

According to an embodiment of a SiC device; the SiC device comprises: a trench extending into a first side of a SiC epitaxial layer of a first conductivity type; an epitaxial material of a second conductivity type opposite the first conductivity type in a bottom of the trench; an electrode structure in the trench, the electrode structure comprising a field electrode on and in electrical contact with the epitaxial material, and a gate electrode electrically insulated from the field electrode and the SiC epitaxial layer; a body region adjacent the gate electrode; and a source region above the body region and adjacent the gate electrode, wherein the body region and the source region are electrically insulated from the gate electrode.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other, Embodiments are depicted in the drawings and are detailed in the description which follows.

DETAILED DESCRIPTION

The embodiments described herein provide a technique for forming a buried doped region of a SiC device. The buried doped region is formed as an epitaxial material deposited in a trench instead of only using implantation. Hence, it is possible that the buried doped region described herein is not prone to variation/mismatch caused by implantation tails. The buried doped region may be formed without requiring a high energy implantation process, without having to form a thick (expensive) implantation mask, and without causing crystal defects. The buried doped region may form a shielding structure for protecting a gate oxide from an excessive electric field. In other embodiments, the buried doped region may form part of a superjunction structure. For example, the thickness of the buried doped region may be in a range between 1-2 µm and a drift layer may vary from 4-5 µm (e.g. for a 650 V device) to 50-100 µm (e.g. for a 6.5-10 kV device). A superjunction drift layer in SiC may be beneficial for higher voltages such as 1.2-3.3 kV and above. The SiC devices described herein may include one or both types of buried doped regions. SiC devices with such buried doped regions are also described.

These SiC devices may have been formed using at least one of the techniques described herein.

FIGS. 1A through 1H, FIGS. 2A through 2H, FIGS. 3A through 3H, and FIGS. 4A through 4I illustrate respective embodiments of a method of forming the doped buried region. In each case, the respective embodiments include: forming a first trench which extends into a first side of a SiC epitaxial layer of a first conductivity type, the first trench terminating at a first depth in the SiC epitaxial layer; at least partly filling the first trench with an epitaxial material of a second conductivity type opposite the first conductivity type; forming a second trench which extends into the first side of the SiC epitaxial layer so that the second trench overlaps the first trench, the second trench terminates at a second depth in the SiC epitaxial layer which is less than the first depth, and the epitaxial material in the first trench laterally extends below a bottom of the second trench; and forming a gate electrode in the second trench and electrically insulated from the SiC epitaxial layer.

According to the embodiment illustrated in FIGS. 1A through 1H, the body region of the SIC device is formed after the epitaxial material of the second conductivity type is formed in the first trench and planarized. This embodiment is described in more detail next.

Figure 1A:
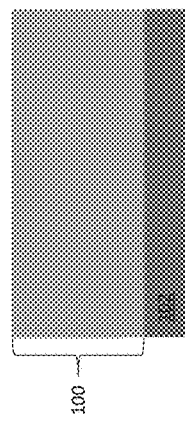
FIGS. 1A through 1H illustrate respective partial cross-sectional views of an embodiment of a method of forming doped buried regions of a SiC device.

FIG. 1A shows a SiC epitaxial layer 100 of the first conductivity type formed on a SiC substrate 102. Hereinafter, a SiC substrate 102 may be either one of a SiC wafer or a further SiC epitaxial layer grown on a SiC wafer. If a SiC wafer is used, the SiC wafer may be removed after crystal growth (i.e. epitaxial growth) of the SiC epitaxial layer 100.

In one embodiment, the SiC epitaxial layer 100 of the first conductivity type and the SiC substrate 102 may be 4H-SiC, In the case of an n-channel power transistor, the SiC epitaxial layer 100 has n-type conductivity. In the case of a p-channel power transistor, the SiC epitaxial layer 100 has p-type conductivity. In either case, the SiC epitaxial layer 100 may form the drift zone of a SiC power transistor. The dopant concentration of the drift zone may be set during crystal growth of the SiC epitaxial layer 100, or may be implanted after crystal growth.

Figure 1B:
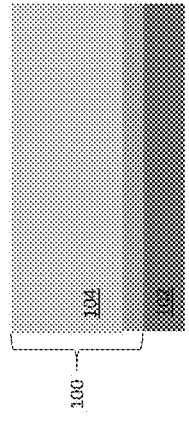

FIG. 1B shows the SiC epitaxial layer 100 after a current-spread implantation process whereby a higher dopant concentration for the drift zone is realized in a region 104 of the SiC epitaxial layer 100 where the bottom of the first trenches is expected. The higher dopant concentration in this region 104 of the drift zone provides increased conductivity for current flow near the bottom of the first trenches. For all embodiments described herein, the current-spread implantation is an optional process step, which may be omitted, for example, in the case of manufacturing a SiC device with a lower breakdown voltage (e.g., a breakdown voltage of 650 V).

Figure 1C:
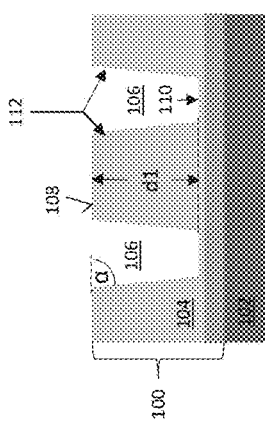

FIG. 1C shows the SiC epitaxial layer 100 after formation of first trenches 106 which extend into a first side 108 of the SiC epitaxial layer 100 and have a bottom 110 which terminates at a first depth d1 in the SiC epitaxial layer 100. The depth d1 may range, e.g., between 1 to 2 µm. The first trenches 106 may be etched into the SiC epitaxial layer 100 to the first depth d1 using a standard dry etch process. The angle α of the trench sidewalls 112 may be controlled from, e.g., 70° to 90°, typically from 84° to 90°.

Figure 1D:
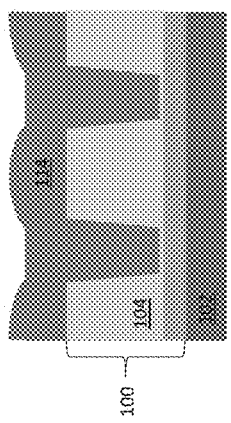

FIG. 1D shows the SiC epitaxial layer 100 after the first trenches 106 are at least partly filled with an epitaxial material 114 of a second conductivity type opposite the first conductivity type. In the case of an n-channel power transistor, the epitaxial material 114 has p-type conductivity. In the case of a p-channel power transistor, the epitaxial material 114 has n-type conductivity. In one embodiment, the first trenches 106 are at least partly filled with the epitaxial material 114 of the second conductivity type by depositing a crystalline SiC overlayer 114 of the second conductivity type on the first side 108 of the SiC epitaxial layer 100 and in the first trenches 106. The epitaxial material 114 of the second conductivity type may be doped in situ. The epitaxial material 114 of the second conductivity type may have a varying doping profile such as a vertical and/or lateral gradient. A varying doping profile may, for example, be provided by varying the dopant concentration during epitaxial growth. For example, the dopant concentration may be reduced during epitaxial growth, such that a dopant concentration is highest at the bottom of the first trench 106 and decreases in the growth direction. In addition or as an alternative, the dopant concentration may be varied during epitaxial growth such that the body region 116 is formed already during epitaxial growth. For example, the dopant concentration may be reduced in a region of the SiC overlayer 114 where the body region 116 is to be formed. In the latter case, no implantation may be required for forming the body region 116.

In addition or as an alternative, the dopant type may be changed during epitaxial growth. For example, an upper part of the crystalline SiC overlayer 114, which may be deposited on the first side 108 of the SiC epitaxial layer 100, may be of the first conductivity type.

Figure 1E:
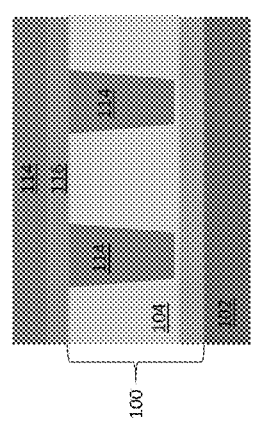

FIG. 1E shows the SiC epitaxial layer 100 after the crystalline SiC overlayer 114 is planarized and a body region 116 of the second conductivity type is formed in the planarized crystalline SiC overlayer 114. The crystalline SiC overlayer 114 may be planarized by chemical-mechanical polishing (CMP), electrical discharge machining (EDM), etc.

Before forming the body region 116, the dopant concentration of the crystalline SiC overlayer 114 in a region of the SiC overlayer 114 where the body region 116 is to be formed may be lower or higher than the dopant concentration of the to-be-formed body region 116. In the latter case of the dopant concentration being higher, counter-doping may be required for forming the body region 116. Further, the dopant concentration of the crystalline SiC overlayer 114 may be higher than the dopant concentration of the body region 116 at least in portions of the crystalline SiC overlayer 114 that are located below the to-be-formed second trench.

In the case of an n-channel device, the body region 116 may be formed by implanting p-type dopant species such as beryllium, boron, aluminium, or gallium into the planarized crystalline SiC overlayer 114. In the case of a p-channel device, the body region 116 may be formed by implanting n-type dopant species such as nitrogen or phosphorus into the planarized crystalline SiC overlayer 114. If counter-doping is required, the doping type of the implanted ions may opposite to the doping type of the channel, i.e. p-type dopants for an p-channel device and n-type dopants for an n-channel device. In either case, this separate implantation allows for precise control of the channel dopant concentration.

Figure 1F:
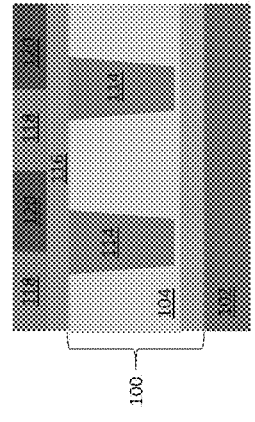

FIG. 1F shows the SiC epitaxial layer 100 after source regions 118 of the first conductivity type and body contact regions 120 of the second conductivity type are formed above the body region 116. In the case of an n-channel device, the source regions 118 may be formed by implanting n-type dopant species into the planarized crystalline SiC overlayer 114 or another epitaxial layer (not shown) formed on the planarized crystalline SiC overlayer 114, and the body contact regions 120 may be formed by implanting p-type dopant species into the planarized crystalline SiC overlayer 114 or another epitaxial layer formed on the planarized crystalline SiC overlayer 114. In the case of a p-channel device, the source regions 118 may be formed by implanting p-type dopant species into the planarized crystalline SiC overlayer 114 or another epitaxial layer formed on the planarized crystalline SiC overlayer 114, and the body contact regions 120 may be formed by implanting n-type dopant species into the planarized crystalline SiC overlayer 114 or another epitaxial layer formed on the planarized crystalline SiC overlayer 114. In either case, these separate implantations allow for precise control of the respective source and body contact dopant concentrations.

Figure 1G:
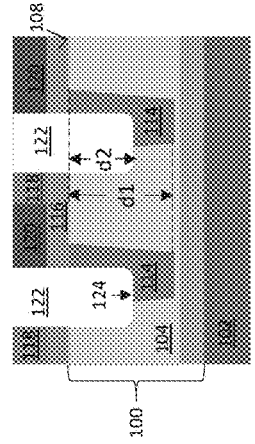

FIG. 1G shows the SiC epitaxial layer 100 after forming second trenches 122 which extend into the first side 108 of the SiC epitaxial layer 100, Each second trench 122 overlaps with a corresponding one of the first trenches 106 (e.g., overlaps in lateral directions and/or in vertical directions), and has a bottom 124 which terminates at a second depth d2 in the SiC epitaxial layer 100 which is less than the first depth d1. The epitaxial material 114 in each first trench 106 laterally extends below the bottom 124 of the corresponding second trench 122. The second trenches 122 may be etched through the planarized crystalline SIC overlayer 114 and into the SiC epitaxial layer 100 using a standard dry etch process. The second trenches 122 form gate trenches of the SiC device.

Figure 1H:
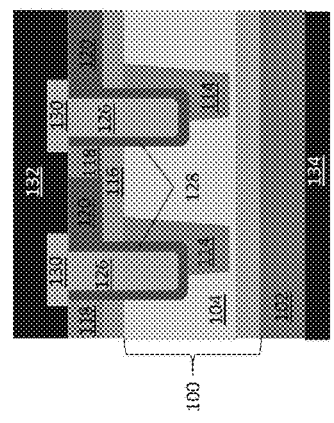

FIG. 1H shows the completed SiC device. A gate electrode 126 is formed in each second trench 122 and electrically insulated from the surrounding SiC epitaxial layer 100 by a gate oxide 128 such as $SiO_2$. The SiC device may include an Interlayer dielectric 130 such as silicate glass which insulates the gate electrodes 126 from an overlying source/emitter electrode 132. The drain/collector electrode 134 may be formed at the opposite side of the SiC device, e.g., in the case of a vertical device.

According to the SiC device embodiment illustrated in FIG. 1H, the epitaxial material 114 remaining in each first trench 106 forms a buried doped region which vertically extends along a lower part of one sidewall of the adjoining second trench 122 to the body region 116 of the SiC device. The SiC device is inactive along this sidewall of each gate trench 122, and thus is an asymmetric device. That is, current flows along one sidewall of each gate trench 122 in forward operation, not along both sidewalls. The buried doped regions 114 form compensation structures which shape the electric field in the SiC device when the device is blocking. When the SiC device is blocking, depletion regions appear from both sides of each buried doped region 114. The spacing between adjacent ones of the buried doped regions 114 defines the strength of the field which reaches the gate oxide 128 and therefore determines the gate oxide reliability. That is, the spacing between adjacent ones of the buried doped regions 114 may determine the gate oxide shielding effectiveness.

According to the embodiment illustrated in FIGS. 2A through 2H, the body region of the SiC device is formed before the trench process used to form the buried doped regions. This embodiment is described in more detail next.

Figure 2A:
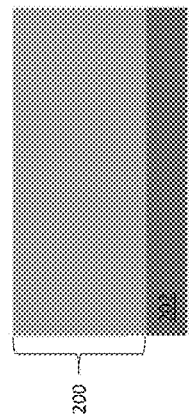
FIGS. 2A through 2H illustrate respective partial cross-sectional views of another embodiment of a method of forming doped buried regions of a SiC device.
Figure 2B:
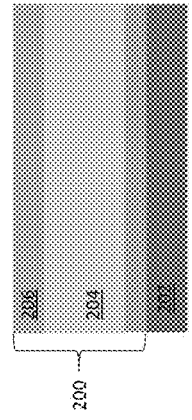

FIG. 2A shows a SiC epitaxial layer 200 of the first conductivity type formed on a SiC substrate 202. In one embodiment, the SiC epitaxial layer 200 of the first conductivity type and the SiC substrate 202 may be 4H-SiC. In the case of an n-channel power transistor, the SiC epitaxial layer 200 has n-type conductivity. In the case of a p-channel power transistor, the SiC epitaxial layer 200 has p-type conductivity. In either case, the SiC epitaxial layer 200 may form the drift zone of a SiC power transistor. The dopant concentration of the drift zone may be set during crystal growth of the SiC epitaxial layer 200, or may be implanted after crystal growth, FIG. 2B shows the SiC epitaxial layer 200 after a current-spread implantation process whereby a higher dopant concentration for the drift zone is realized in a region 204 of the SiC epitaxial layer 200 where the bottom of the first trenches is expected. The higher dopant concentration in this region 204 of the drift zone provides increased conductivity for current flow near the bottom of the first trenches. Before forming the first trenches, a body region 206 of the second conductivity type is formed in the SiC epitaxial layer 200. In the case of an n-channel device, the body region 206 may be formed by implanting p-type dopant species such as beryllium, boron, aluminium, or gallium into the SiC epitaxial layer 200. In the case of a p-channel device, the body region 206 may be formed by implanting n-type dopant species such as nitrogen or phosphorus into the SiC epitaxial layer 200. In either case, this separate implantation allows for precise control of the channel dopant concentration.

Figure 2C:
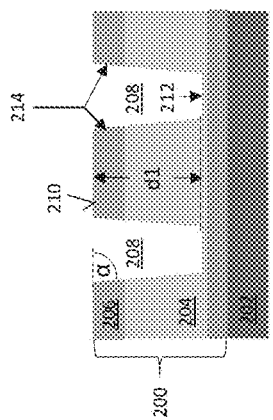

FIG. 2C shows the SiC epitaxial layer 200 after formation of first trenches 208 which extend into a first side 210 of the SiC epitaxial layer 200 and have a bottom 212 which terminates at a first depth d1 in the SiC epitaxial layer 200. The first trenches 208 may be etched into the SiC epitaxial layer 200 to the first depth d1 using a standard dry etch process. The angle α of the trench sidewalls 214 may be controlled from 70° to 90°.

Figure 2D:
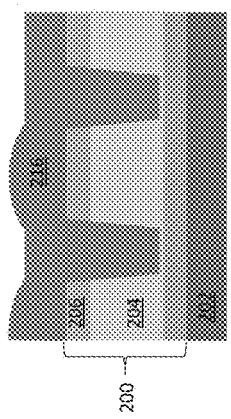

FIG. 2D shows the SiC epitaxial layer 200 after the first trenches 208 are at least partly filled with an epitaxial material 216 of a second conductivity type opposite the first conductivity type. In the case of an n-channel power transistor, the epitaxial material 216 has p-type conductivity. In the case of a p-channel power transistor, the epitaxial material 216 has n-type conductivity. In one embodiment, the first trenches 208 are at least partly filled with the epitaxial material 216 of the second conductivity type by depositing a crystalline SiC overlayer 216 of the second conductivity type on the first side 210 of the SiC epitaxial layer 200 and in the first trenches 208. The epitaxial material 216 of the second conductivity type may be doped in situ. The epitaxial material 216 of the second conductivity type may have a varying doping profile such as a vertical and/or lateral gradient.

Figure 2E:
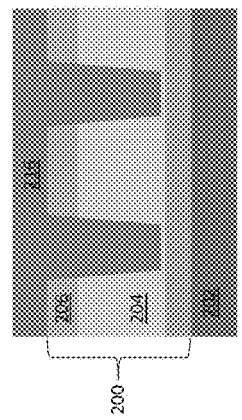

FIG. 2E shows the SiC epitaxial layer 200 after the crystalline SiC overlayer 216 is planarized. The crystalline SiC overlayer 216 may be planarized by CMP, EDM, etc.

Figure 2F:
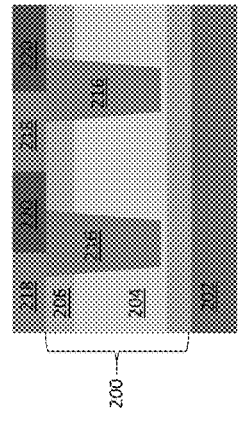

FIG. 2F shows the SiC epitaxial layer 200 after source regions 218 of the first conductivity type and body contact regions 220 of the second conductivity type are formed above the body region 206. In the case of an n-channel device, the source regions 218 may be formed by implanting n-type dopant species into the planarized crystalline SiC overlayer 216 or another epitaxial layer (not shown) formed on the planarized crystalline SiC overlayer 216, and the body contact regions 220 may be formed by implanting p-type dopant species into the planarized crystalline SiC overlayer 216 or another epitaxial layer formed on the planarized crystalline SiC overlayer 216. In the case of a p-channel device, the source regions 218 may be formed by implanting p-type dopant species into the planarized crystalline SiC overlayer 216 or another epitaxial layer formed on the planarized crystalline SiC overlayer 216, and the body contact regions 220 may be formed by implanting n-type dopant species into the planarized crystalline SiC overlayer 216 or another epitaxial layer formed on the planarized crystalline SiC overlayer 216. In either case, these separate implantations allow for precise control of the respective source and body contact dopant concentrations.

Figure 2G:
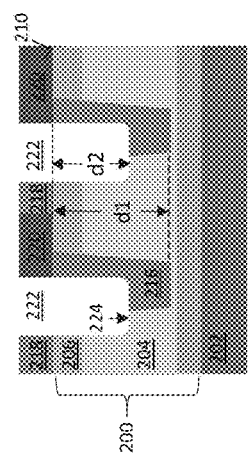

FIG. 2G shows the SiC epitaxial layer 200 after forming second trenches 222 which extend into the first side 210 of the SiC epitaxial layer 200. Each second trench 222 overlaps with a corresponding one of the first trenches 208, and has a bottom 224 which terminates at a second depth d2 in the SiC epitaxial layer 200 which is less than the first depth d1. The epitaxial material 216 in each first trench 208 laterally extends below the bottom 224 of the corresponding second trench 222. The second trenches 222 may be etched into the SiC epitaxial layer 200 using a standard dry etch process. The second trenches 222 form gate trenches of the SiC device.

Figure 2H:
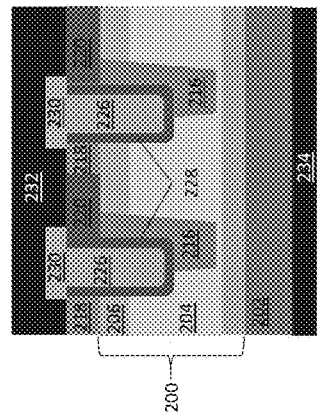

FIG. 2H shows the completed SiC device. A gate electrode 226 is formed in each second trench 222 and electrically insulated from the surrounding SiC epitaxial layer 200 by a gate oxide 228 such as $SiO_2$. The SiC device may include an interlayer dielectric 230 such as silicate glass which insulates the gate electrodes 226 from an overlying source/emitter electrode 232. The drain/collector electrode 234 may be formed at the opposite side of the SiC device, e.g., in the case of a vertical device.

Similar to the embodiment shown in FIG. 1H, the SiC device illustrated in FIG. 2H has epitaxial material 216 remaining in each first trench 208 which forms a buried doped region that vertically extends along a lower part of one sidewall of the adjoining second trench 222 to the body region 206 of the SiC device. The SiC device is inactive along this sidewall of each gate trench 222, and thus is an asymmetric device. The buried doped regions 216 form compensation structures which shape the electric field in the SiC device when the device is blocking, as previously explained herein.

According to the embodiment illustrated in FIGS. 3A through 3H, the body region of the SiC device is formed after the epitaxial material of the second conductivity type is formed in the first trench and planarized. This embodiment is described in more detail next.

Figure 3A:
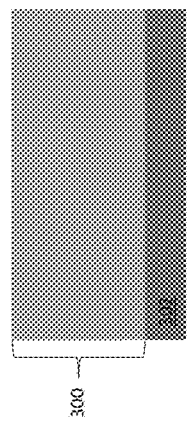
FIGS. 3A through 3H illustrate respective partial cross-sectional views of another embodiment of a method of forming doped buried regions of a SiC device.

FIG. 3A shows a SiC epitaxial layer 300 of the first conductivity type formed on a SiC substrate 302. In one embodiment, the SiC epitaxial layer 300 of the first conductivity type and the SiC substrate 302 may be 4H-SiC. In the case of an n-channel power transistor, the SiC epitaxial layer 300 has n-type conductivity. In the case of a p-channel power transistor, the SiC epitaxial layer 300 has p-type conductivity. In either case, the SiC epitaxial layer 300 may form the drift zone of a SiC power transistor. The dopant concentration of the drift zone may be set during crystal growth of the SiC epitaxial layer 300, or may be implanted after epitaxial growth.

Figure 3B:
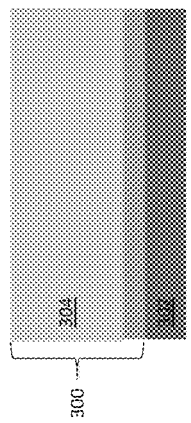
Figure 3C:
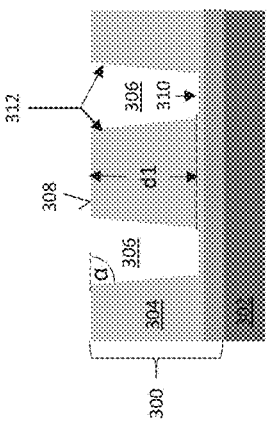

FIG. 3B shows the SiC epitaxial layer 300 after a current-spread implantation process whereby a higher dopant concentration for the drift zone is realized in a region 304 of the SiC epitaxial layer 300 where the bottom of the first trenches is expected. The higher dopant concentration in this region 304 of the drift zone provides increased conductivity for current flow near the bottom of the first trenches, FIG. 3C shows the SiC epitaxial layer 300 after formation of first trenches 306 which extend into a first side 310 of the SiC epitaxial layer 300 and have a bottom 312 which terminates at a first depth d1 in the SiC epitaxial layer 300, The first trenches 308 may be etched into the SiC epitaxial layer 300 to the first depth d1 using a standard dry etch process. The angle α of the trench sidewalls 314 may be controlled from 70° to 90°.

Figure 3D:
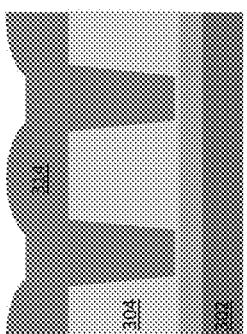

FIG. 3D shows the SiC epitaxial layer 300 after the first trenches 306 are at least partly filled with an epitaxial material 314 of a second conductivity type opposite the first conductivity type. In the case of an n-channel power transistor, the epitaxial material 314 has p-type conductivity. In the case of a p-channel power transistor, the epitaxial material 314 has n-type conductivity. In one embodiment, the first trenches 306 are at least partly filled with the epitaxial material 314 of the second conductivity type by depositing a crystalline SiC overlayer 314 of the second conductivity type on the first side 308 of the SiC epitaxial layer 300 and in the first trenches 306, The epitaxial material 314 of the second conductivity type may be doped in situ. The epitaxial material 314 of the second conductivity type may have a varying doping profile such as a vertical and/or lateral gradient.

Figure 3E:
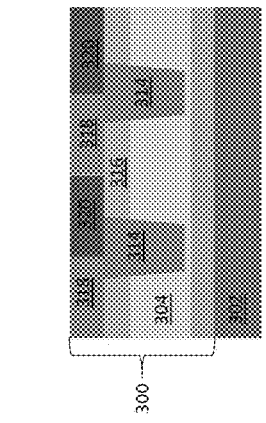

FIG. 3E shows the SiC epitaxial layer 300 after the crystalline SiC overlayer 314 is planarized. The crystalline SiC overlayer 314 may be planarized by CMP, EDM, etc.

Figure 3F:
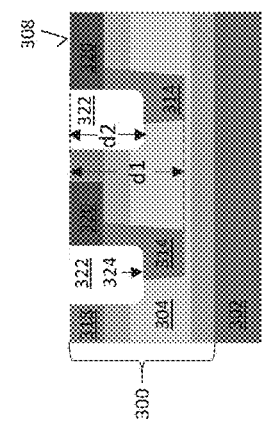

FIG. 3F shows the SiC epitaxial layer 300 after forming a body region 316 of the second conductivity type at or near the first side 308 of the SiC epitaxial layer 300 adjacent the first trenches 306, and after forming source regions 318 of the first conductivity type and body contact regions 320 of the second conductivity type above the body region 316. In the case of an n-channel device, the body region 316 may be formed by implanting p-type dopant species into the SiC epitaxial layer 300, the source regions 318 may be formed by implanting n-type dopant species into the SiC epitaxial layer 300 or another epitaxial layer (not shown) formed on the SiC epitaxial layer 300, and the body contact regions 320 may be formed by implanting p-type dopant species into the SiC epitaxial layer 300 or another epitaxial layer formed on the SiC epitaxial layer 300. In the case of a p-channel device, the body region 316 may be formed by implanting n-type dopant species into the SiC epitaxial layer 300, the source regions 318 may be formed by implanting p-type dopant species into the SiC epitaxial layer 300 or another epitaxial layer formed on the SiC epitaxial layer 300, and the body contact regions 320 may be formed by implanting n-type dopant species into the SiC epitaxial layer 300 or another epitaxial layer formed on the SiC epitaxial layer 300, In either case, these separate implantations allow for precise control of the respective body, source and body contact dopant concentrations.

Figure 3G:
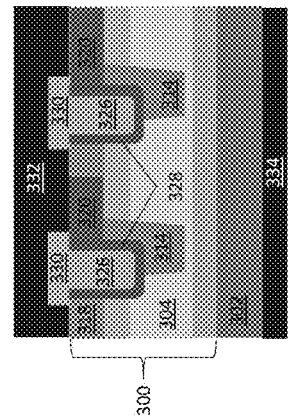

FIG. 3G shows the SiC epitaxial layer 300 after forming second trenches 322 which extend into the first side 308 of the SiC epitaxial layer 300. Each second trench 322 overlaps with a corresponding one of the first trenches 306, and has a bottom 324 which terminates at a second depth d2 in the SiC epitaxial layer 300 which is less than the first depth d1. The epitaxial material 314 in each first trench 306 laterally extends below the bottom 324 of the corresponding second trench 322. The second trenches 322 may be etched into the SiC epitaxial layer 300 using a standard dry etch process. The second trenches 322 form gate trenches of the SiC device.

Figure 3H:
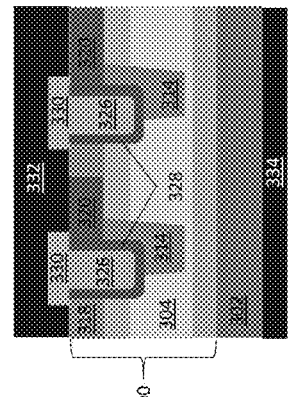

FIG. 3H shows the completed SiC device. A gate electrode 326 is formed in each second trench 322 and electrically insulated from the surrounding SiC epitaxial layer 300 by a gate oxide 328 such as $SiO_2$. The SiC device may include an interlayer dielectric 330 such as silicate glass which insulates the gate electrodes 326 from an overlying source/emitter electrode 332. The drain/collector electrode 334 may be formed at the opposite side of the SiC device, e.g., in the case of a vertical device.

Similar to the embodiments shown in FIGS. 1H and 2H, the SiC device illustrated in FIG. 3H has epitaxial material 314 remaining in each first trench 306 which forms a buried doped region that vertically extends along a lower part of one sidewall of the adjoining second trench 322 to the body region 316 of the SiC device. The SiC device is inactive along this sidewall of each gate trench 322, and thus is an asymmetric device. The buried doped regions 314 form compensation structures which shape the electric field in the SiC device when the device is blocking, as previously explained herein.

According to the embodiment illustrated in FIGS. 4A through 4I, the trenches used to form the buried doped regions have a stepped profile with a wider upper part and a narrower lower part. This embodiment is described in more detail next.

Figure 4C:
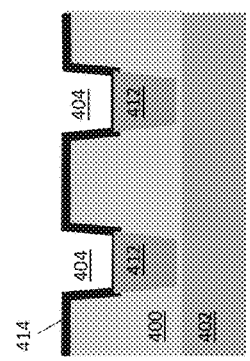
FIGS. 4A through 4I illustrate respective partial cross-sectional views of another embodiment of a method of forming doped buried regions of a SiC device.
Figure 4B:
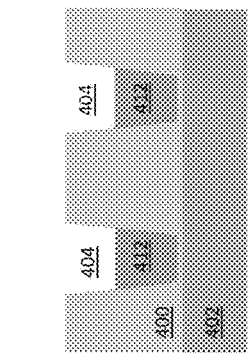
Figure 4A:
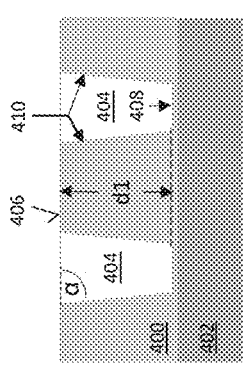

FIG. 4A shows a SiC epitaxial layer 400 of the first conductivity type formed on a SiC substrate 402. In one embodiment, the SiC epitaxial layer 400 of the first conductivity type and the SiC substrate 402 may be 4H-SiC. In the case of an n-channel power transistor, the SiC epitaxial layer 400 has n-type conductivity. In the case of a p-channel power transistor, the SiC epitaxial layer 400 has p-type conductivity. In either case, the SiC epitaxial layer 400 may form the drift zone of a SiC power transistor. The dopant concentration of the drift zone may be set during crystal growth of the SiC epitaxial layer 400, or may be implanted after epitaxial growth.

First trenches 404 extend into a first side 406 of the SiC epitaxial layer 400 and have a bottom 408 which terminates at a first depth d1 in the SiC epitaxial layer 400. The first trenches 404 may be etched into the SiC epitaxial layer 400 to the first depth d1 using a standard dry etch process. The angle α of the trench sidewalls 410 may be controlled from 70° to 90°.

FIG. 4B shows the SiC epitaxial layer 400 after filling a lower part of the first trenches with an insulating material 412 such as oxide. The oxide is partially etched away to a desired thickness which corresponds to where the step in the first trenches 404 will be formed.

FIG. 4C shows the SiC epitaxial layer 400 after sacrificial oxidation 414 of the exposed upper part of the first trench sidewalls 410. The insulating material 412 in the bottom of the first trenches 404 prevents sacrificial oxidation along the covered lower part of the first trench sidewalls 410.

Figure 4F:
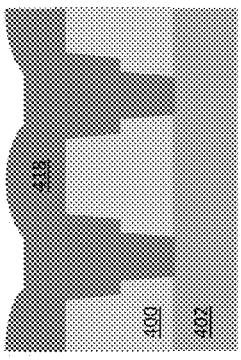
Figure 4E:
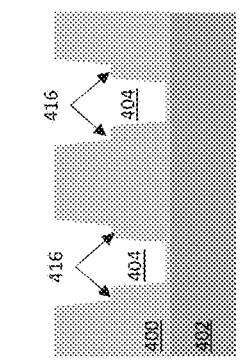
Figure 4D:
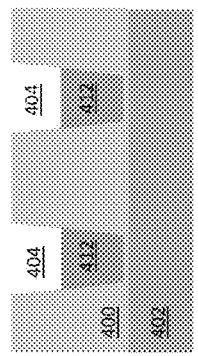

FIG. 4D shows the SiC epitaxial layer 400 after the sacrificial oxidation 414 is removed. In the case of thermally grown $SiO_2$, the sacrificial oxidation 414 may be removed by a HF solution. Removal of the sacrificial oxidation 414 widens the upper part of the first trenches 404 which is devoid of (i.e. free of) the insulating material 412, so that the first trenches 404 have a step transition 416 between the upper part and the lower part. The insulating material 412 is removed from the lower part of the first trenches 404 after widening the upper part of the first trenches 404.

FIG. 4E shows the SiC epitaxial layer 400 after the first trenches 404 are at least partly filled with an epitaxial material 418 of a second conductivity type opposite the first conductivity type. In the case of an n-channel power transistor, the epitaxial material 418 has p-type conductivity. In the case of a p-channel power transistor, the epitaxial material 418 has n-type conductivity. In one embodiment, the first trenches 404 are at least partly filled with the epitaxial material 418 of the second conductivity type by depositing a crystalline SiC overlayer 418 of the second conductivity type on the first side 406 of the SiC epitaxial layer 400 and in the first trenches 404. The epitaxial material 418 of the second conductivity type may be doped in situ. The epitaxial material 418 of the second conductivity type may have a varying doping profile such as a vertical and/or lateral gradient.

FIG. 4F shows the SiC epitaxial layer 400 after the crystalline SiC overlayer 418 is planarized. The crystalline SiC overlayer 418 may be planarized by CMP, EDM, etc. The planarization may be performed in accordance with the embodiment illustrated in FIGS. 2A through 2H.

Figure 4I:
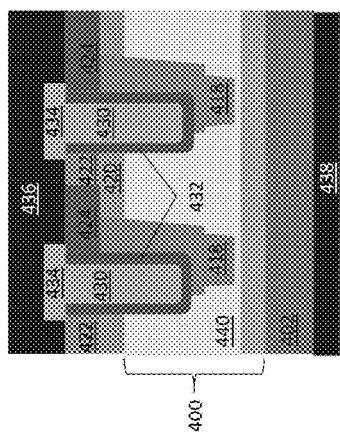
Figure 4H:
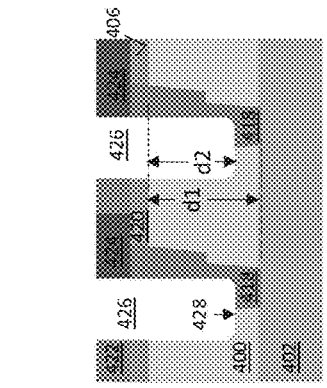
Figure 4G:
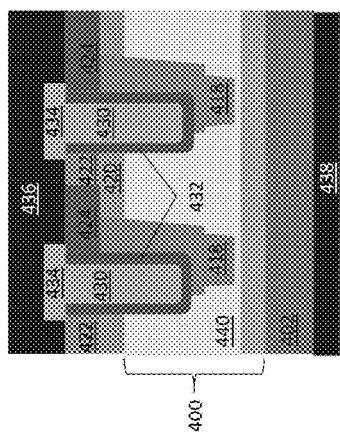

FIG. 4G shows the SiC epitaxial layer 200 after forming a body region 420 of the second conductivity type at or near the first side 406 of the SiC epitaxial layer 400 adjacent the first trenches 404, and after forming source regions 422 of the first conductivity type and body contact regions 424 of the second conductivity type above the body region 420. In the case of an n-channel device, the body region 420 may be formed by implanting p-type dopant species into the SiC epitaxial layer 400, the source regions 422 may be formed by implanting n-type dopant species into the SiC epitaxial layer 400 or another epitaxial layer (not shown) formed on the SiC epitaxial layer 400, and the body contact regions 424 may be formed by implanting p-type dopant species into the SiC epitaxial layer 400 or another epitaxial layer formed on the SiC epitaxial layer 400. In the case of a p-channel device, the body region 420 may be formed by implanting n-type dopant species into the SiC epitaxial layer 400, the source regions 422 may be formed by implanting p-type dopant species into the SiC epitaxial layer 400 or another epitaxial layer formed on the SiC epitaxial layer 400, and the body contact regions 424 may be formed by implanting n-type dopant species into the SiC epitaxial layer 400 or another epitaxial layer formed on the SiC epitaxial layer 400. In either case, these separate implantations allow for precise control of the respective body, source and body contact dopant concentrations.

FIG. 4H shows the SiC epitaxial layer 400 after forming second trenches 426 which extend into the first side 406 of the SiC epitaxial layer 400. Each second trench 426 overlaps with a corresponding one of the first trenches 404, and has a bottom 428 which terminates at a second depth d2 in the SiC epitaxial layer 400 which is less than the first depth d1. The epitaxial material 418 in each first trench 404 laterally extends below the bottom 428 of the corresponding second trench 426. The second trenches 426 may be etched into the SiC epitaxial layer 300 using a standard dry etch process. In one embodiment, the second trenches 426 are etched to the second depth d2 which is below the step transition 416 of the first trenches 404. The second trenches 426 form gate trenches of the SiC device.

FIG. 4I shows the completed SiC device. A gate electrode 430 is formed in each second trench 426 and electrically insulated from the surrounding SiC epitaxial layer 400 by a gate oxide 432 such as $SiO_2$. The SiC device may include an interlayer dielectric 434 such as silicate glass which insulates the gate electrodes 430 from an overlying source/emitter electrode 436. The drain/collector electrode 438 may be formed at the opposite side of the SiC device, e.g., in the case of a vertical device. The SiC epitaxial layer 400 of the SiC device may include a region 440 having a higher dopant concentration for providing increased conductivity for current flow near the bottom of the first trenches 404, as previously described herein.

Similar to the embodiments shown in FIGS. 1H, 2H and 3H, the SiC device illustrated in FIG. 4I has epitaxial material 418 remaining in each first trench 404 which forms a buried doped region that vertically extends along a lower part of one sidewall of the adjoining second trench 426 to the body region 420 of the SiC device. The SiC device is inactive along this sidewall of each gate trench 426, and thus is an asymmetric device. The buried doped regions 418 form compensation structures which shape the electric field in the SiC device when the device is blocking, as previously explained herein.

The method embodiments illustrated in FIGS. 1A through 1H, FIGS. 2A though 2H, FIGS. 3A through 3H and FIGS. 4A through 4I each avoid forming the buried doped regions by implantation. An epitaxy process instead is used to form the buried doped regions, providing a superior dopant profile compared to ion implantation. The dopant concentration of the buried doped regions can be readily varied during the epitaxial growth process. Since no mask is needed to form the buried doped regions, no mask edge induced scattering effects occur when forming the buried doped regions which would otherwise drive the deep profile up toward the surface of the SiC device. The size of the buried doped regions and thus the resulting pn-junctions with the drift zone are precisely controlled by the trench etch process. This avoids lateral straggling of the buried doped regions and implantation mask angle influences. Moreover, no implantation-induced crystal damage occurs which otherwise is a potential cause for increased leakage current. The trench etch process used to form the buried doped regions allows a degree of freedom with the sidewall angle, offering pitch shrinkage and therefore smaller cell size.

The embodiments illustrated in FIGS. 1A through 1H, FIGS. 2A though 2H, FIGS. 3A through 3H and FIGS. 4A through 4I are not mutually exclusive. For example, the process steps in FIGS. 4A through 4I used to form the first trenches 404 with the step transition 416 may be combined with the process steps shown in FIGS. 2A through 2H used to form the body region 206 before trench formation. In another example, the process steps in FIGS. 4A through 4I used to form the first trenches 404 with the step transition 416 may be combined with the process steps shown in FIGS. 3A through 3H used to form the body region 316 after trench formation, e.g., by using a mask. In still another example, the process steps in FIGS. 4A through 4I used to form the first trenches 404 with the step transition 416 may be combined with the process steps described in conjunction with FIGS. 1A through 1H and used to vary the dopant concentration and/or counter-doping.

Figure 5C:
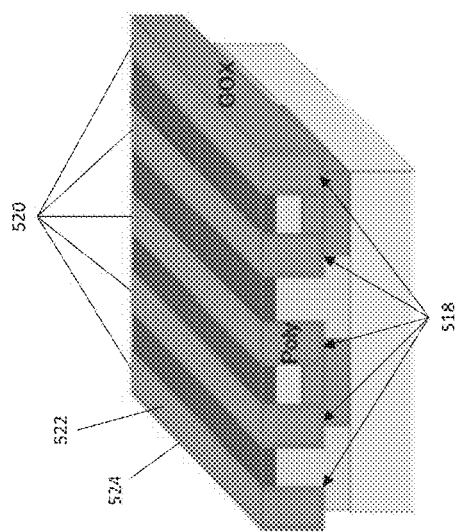
FIGS. 5A through 5C illustrate respective partial cross-sectional views of an embodiment of a method of manufacturing an SiC device having rows of trenches used to form buried doped regions by epitaxial growth.
Figure 5B:
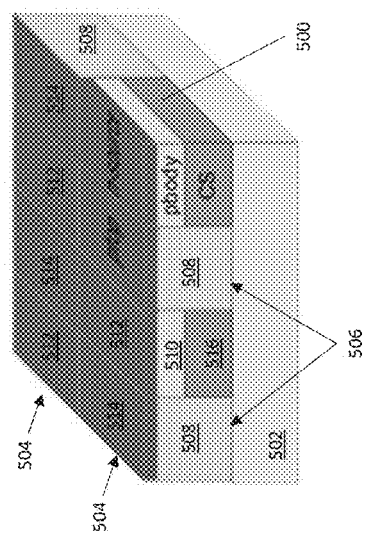
Figure 5A:
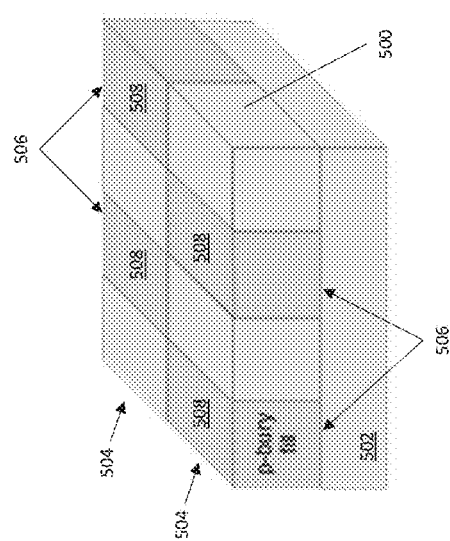

FIGS. 5A through 5C illustrate an embodiment of a method of manufacturing an n-channel SiC device which has a plurality of rows of first trenches used to form buried doped regions by epitaxial growth instead of by ion implantation. The conductivity types of the various device regions may be reversed to form a p-channel device.

FIG. 5A shows an n-type SiC epitaxial layer 500 formed on an n-type epitaxial drift layer 502. In one embodiment, the n-type SiC epitaxial layer 500 and the n-type epitaxial drift layer 502 may be 4H-SiC. The dopant concentration of the drift zone may be set during crystal growth of the n-type SiC epitaxial layer 500, or may be implanted after epitaxial growth. The SiC device has a plurality of rows 504 of first trenches 506 in which p-type doped regions 508 ('p-bury fill') are formed by epitaxial growth. In one embodiment, the first trenches 506 are at least partly filled with p-type epitaxial material as part of an epitaxial growth process and then planarized, as previously described herein. The p-type epitaxial material 508 may be doped in situ. The p-type epitaxial material 508 may have a varying doping profile such as a vertical and/or lateral gradient.

FIG. 5B shows the n-type SiC epitaxial layer 500 after p-type body regions 510 ('pbody'), n-type source regions 512 ('n-source') p-type body contact regions 514 ('ptop') and p-type current spread regions 516 ('CS') are formed in the n-type SiC epitaxial layer 500 and/or in an additional epitaxial layer formed on the n-type SiC epitaxial layer 500. The current spread regions 516 may be present in the other embodiments described herein, but is not illustrated in the corresponding figures. The current spread regions 516 are formed in the n-type epitaxial drift layer 502 and have a higher doping concentration. The p-type body regions 510 and the p-type current spread regions 516 may be formed by a planar implant. A checkerboard implant of n+ and p+ dopants species may be used to form the n-type source regions 512 and the p-type body contact regions 514.

The rows 504 of first trenches 506 are spaced apart from one another by the p-type body regions 510. The first trenches 506 in adjacent rows 504 are offset from one another so that a first trench 506 in one row 504 adjoins a p-type body region 510 of an adjacent row 504. Two rows 504 of first trenches 506 are shown in FIGS. 5A through 5C for ease of illustration. The SiC device may include more than two rows 504 of first trenches 506.

FIG. 5C shows the n-type SiC epitaxial layer 500 after rows 518 of gate trenches 520 are formed in the n-type SiC epitaxial layer 500. The gate trenches 520 extend lengthwise in a direction transverse to the rows 504 of first trenches 506, so that alternating first trenches 506 and body regions 510 are arranged along the length of two adjacent second trenches 520. The gate trenches 520 include a gate electrode 522 ('Poly') electrically insulated from the n-type SiC epitaxial layer 500 by a gate oxide 524 ('GOX') such as SiO$_2$.

FIGS. 6A through 6H illustrate another embodiment of a method of forming a doped buried region. The method includes forming a trench which extends into a first side of a SiC epitaxial layer of a first conductivity type, forming an epitaxial material of a second conductivity type opposite the first conductivity type in a bottom of the trench, forming an electrode structure in the trench, the electrode structure comprising a field electrode on and in electrical contact with the epitaxial material, and a gate electrode electrically insulated from the field electrode and the SiC epitaxial layer, and forming a body region adjacent the gate electrode, and a source region above the body region and adjacent the gate electrode, the body region and the source region being electrically insulated from the gate electrode. Different than the SiC devices illustrated in FIGS. 1H, 2H, 3H, 4I and 5O, the resulting SiC device is symmetric in that current flows along both sidewalls of each gate trench in forward operation.

Figure 6A:
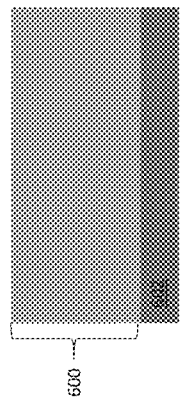
FIGS. 6A through 6H illustrate respective partial cross-sectional views of another embodiment of a method of forming doped buried regions of a SiC device.

FIG. 6A shows a SiC epitaxial layer 600 of the first conductivity type formed on a SiC substrate 602. In one embodiment, the SiC epitaxial layer 600 of the first conductivity type and the SiC substrate 602 may be 4H-SiC. In the case of an n-channel power transistor, the SiC epitaxial layer 600 has n-type conductivity. In the case of a p-channel power transistor, the SiC epitaxial layer 600 has p-type conductivity. In either case, the SiC epitaxial layer 600 may form the drift zone of a SiC power transistor. The dopant concentration of the drift zone may be set during crystal growth of the SiC epitaxial layer 600, or may be implanted after epitaxial growth.

Figure 6B:
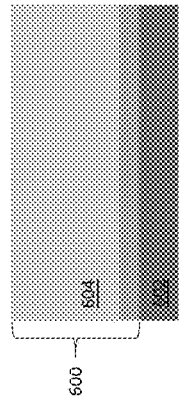

FIG. 6B shows the SiC epitaxial layer 600 after a current-spread implantation process whereby a higher dopant concentration for the drift zone is realized in a region 604 of the SiC epitaxial layer 600 where the bottom of the first trenches is expected. The higher dopant concentration in this region 604 of the drift zone provides increased conductivity for current flow near the bottom of the first trenches.

Figure 6C:
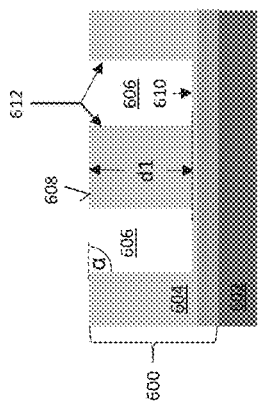

FIG. 6C shows the SiC epitaxial layer 600 after formation of gate trenches 606 which extend into a first side 608 of the SiC epitaxial layer 600 and have a bottom 610 which terminates at a first depth d1 in the SiC epitaxial layer 600. The gate trenches 606 may be etched into the SiC epitaxial layer 600 to the first depth d1 using a standard dry etch process. The angle α of the trench sidewalls 612 may be controlled from 70° to 90°.

Figure 6D:
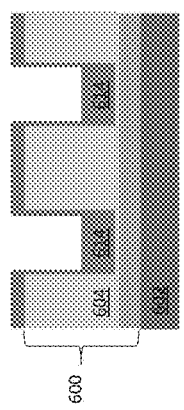

FIG. 6D shows the SiC epitaxial layer 600 after the gate trenches 606 are partly filled with an epitaxial material 614 of a second conductivity type opposite the first conductivity type. In the case of an n-channel power transistor, the epitaxial material 614 has p-type conductivity. In the case of a p-channel power transistor, the epitaxial material 614 has n-type conductivity. In one embodiment, the gate trenches 606 are partly filled with the epitaxial material 614 of the second conductivity type by depositing a crystalline SiC overlayer 614 of the second conductivity type on the first side 608 of the SiC epitaxial layer 600 and on the bottom 610 of the gate trenches 606. The epitaxial material 614 of the second conductivity type may be doped in situ. The epitaxial material 614 of the second conductivity type may have a varying doping profile such as a vertical and/or lateral gradient.

Figure 6E:
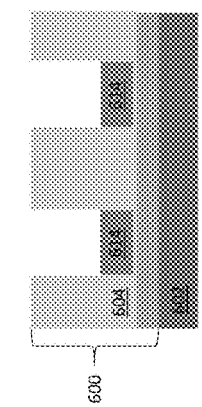

FIG. 6E shows the SiC epitaxial layer 600 after the crystalline SiC overlayer 614 is removed from the first side 608 of the SiC epitaxial layer 600 and from the upper part of the first trench sidewalls 612. The crystalline SiC overlayer 614 may be removed from the first side 608 of the SiC epitaxial layer 600 and from the upper part of the first trench sidewalls 612 by oxidation and wet etching. The remaining epitaxial material 614 at the bottom 610 of the gate trenches 606 forms the buried doped regions.

Figure 6F:
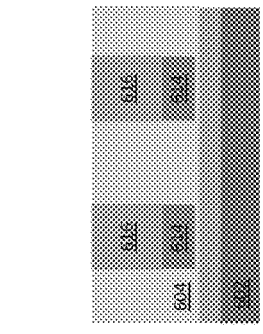

FIG. 6F shows the SiC epitaxial layer 600 after the gate trenches 606 are filled with an oxide 616 and then planarized, e.g., via CMP.

Figure 6G:
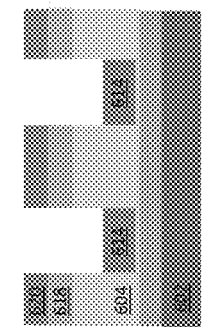

FIG. 6G shows the SiC epitaxial layer 600 after a body region 618 of the second conductivity type and a source region 620 of the first conductivity type are formed in the SiC epitaxial layer 600 or another epitaxial layer (not shown) formed above the SiC epitaxial layer 600. The body regions 618 and the source regions 620 may be formed using standard ion implantation and annealing processes.

Figure 6H:
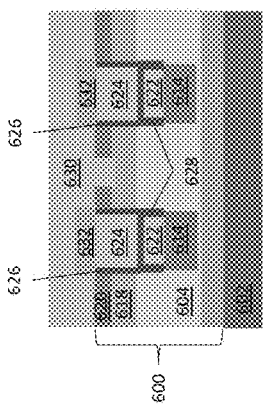

FIG. 6H shows the SiC epitaxial layer 600 after an electrode structure is formed in the gate trenches 606. Each electrode structure includes a field electrode 622 on and in electrical contact with the epitaxial material 614 at the bottom 610 of the gate trenches 606, and a gate electrode 624 above the field electrode 622 and electrically insulated from the field electrode 622 and the SiC epitaxial layer 600. The gate electrodes 624 may be electrically insulated from the SiC epitaxial layer 600 by a gate oxide 626 such as SiO$_2$. The field electrodes 622 may be electrically insulated from the gate electrodes 624 by a thicker field oxide 628 such as SiO$_2$. A source/emitter electrode 630 may be formed above the first side 608 of the SiC epitaxial layer 600. An interlayer dielectric 632 such as silicate glass which insulates the gate electrodes 624 from the overlying source/emitter electrode 630. The field electrodes 622 may be electrically connected to the source/emitter electrode 630 in a region of the SiC device out of view.

The SiC device manufactured according to the method illustrated in FIGS. 6A through 6H has a symmetric cell layout in that current may flow on both sides of the gate trenches 606, which allows for a smaller cell pitch. The SiC device also has a dual-poly trench structure in which a field electrode 622 and a gate electrode 624 are formed in the gate trenches 606. The buried doped region 614 at the bottom of the gate trenches 606 is restricted to below the gate trenches, so as to not interfere with the channel on both sides of the gate trenches 606. The buried doped region 614 at the bottom of the gate trenches 606 is contacted by the field electrode 622 in the gate trench 606, not along one side of the gate trench 606. The buried doped region 614 at the bottom of the gate trenches 606 may form a shielding structure for protecting the gate oxide 626 from an excessive electric field. In other embodiments, the buried doped region 614 at the bottom of the gate trenches 606 may form part of a superjunction structure. The SiC device may include one or both types of buried doped regions.

FIGS. 7 through 10 illustrate additional embodiments of SiC devices which include a buried doped region. The embodiments illustrated in FIGS. 7 through 10 may be combined with any of the embodiments previously described herein.

Figure 7:
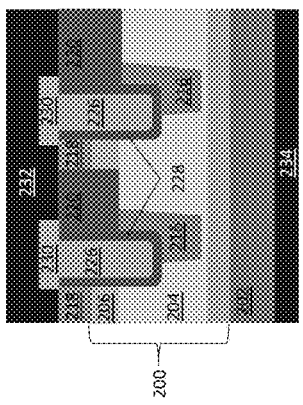

The SiC device illustrated in FIG. 7 is similar to the SiC device illustrated in FIG. 2H. Different, however, the body contact regions 220 of the second conductivity type extend through the body region 206 to the buried doped regions 216. The deeper body contact regions 220 may be formed by implementing a deeper (higher-energy) ion implantation of a dopant species of the second conductivity type, or by implementing an additional mask and implantation process prior to trench etching.

Figure 8:
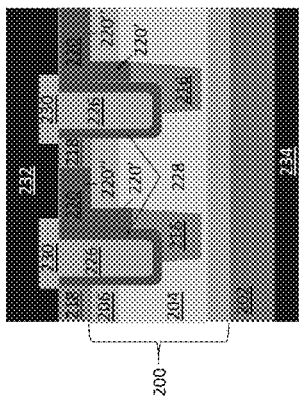

The SiC device illustrated in FIG. 8 is similar to the SiC device illustrated in FIG. 7. Different, however, the body contact regions 220 do not have a relatively uniform width over their thickness. Instead, the body contact regions 220 have a deeper, narrower part 220' which contacts the buried doped regions 216. The upper, wider part 220" of the body contact regions 220 extends over the body region 206 as shown in FIG. 8 or under the body region 206 which is not illustrated. In either case, such a body contact region may be performed by appropriate control of the ion implantation and/or masking processes.

Figure 9:
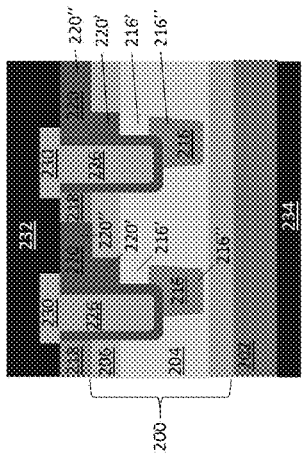

The SiC device illustrated in FIG. 9 is similar to the SiC device illustrated in FIG. 8. Different, however, the buried doped regions 216 have an upper section 216' with a lower doping concentration and a lower section 216" with a higher doping concentration. The upper section 216' with the lower doping concentration is in contact with the deeper, narrower part 220' of the corresponding buried doped region 216. The buried doped regions 216 may be formed with an upper section 216' having a lower doping concentration and a lower section 216" having a higher doping concentration during epitaxial growth, where the doping concentration may be varied, such that the doping concentration is lower in the lower part of the body region 206. This allows the body regions 216 to be formed by regular implantation with no counter-doping required.

Figure 10:
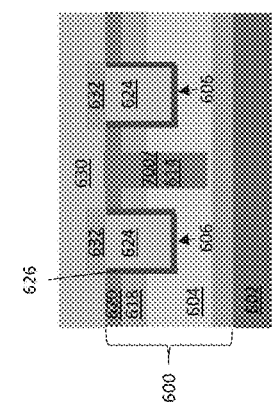
FIGS. 7 through 10 illustrate respective partial cross-sectional views of additional embodiments of SiC devices which include a buried doped region.

The SiC device illustrated in FIG. 10 is similar to the SiC device illustrated in FIG. 6H. Different, however, a shielding region 700 formed by the epitaxial material 614 is positioned between the gate trenches 606. The body region 618 may, for example, be connected in a third dimension, i.e. in the drawing plane shown in FIG. 10. Neighboring shielding regions 700 may act as a JFET. During manufacturing, the doping concentration in the shielding region 700 may be varied, so that the doping concentration is lower in the upper area or (preferably) higher in the upper area to allow for a good (e.g. ohmic) connection to source/emitter electrode 630.

Terms such as "first", "second", and the like, are used to describe various elements, regions, sections, etc. and are also not intended to be limiting. Like terms refer to like elements throughout the description.

As used herein, the term "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a doped buried region of a SiC device, the method comprising:
    forming a first trench which extends into a first side of a SiC epitaxial layer of a first conductivity type, the first trench terminating at a first depth in the SiC epitaxial layer;
    at least partly filling the first trench with an epitaxial material of a second conductivity type opposite the first conductivity type;
    forming a second trench which extends into the first side of the SiC epitaxial layer so that the second trench overlaps the first trench, the second trench terminates at a second depth in the SiC epitaxial layer which is less than the first depth, and the epitaxial material in the first trench laterally extends below a bottom of the second trench; and
    forming a gate electrode in the second trench and electrically insulated from the SiC epitaxial layer.

2. The method of claim 1, wherein the epitaxial material in the first trench vertically extends along a lower part of a first sidewall of the second trench, and wherein a body region of the SiC device adjoins the epitaxial material at the first sidewall of the second trench or is formed in the epitaxial material.

3. The method of claim 1, wherein at least partly filling the first trench with the epitaxial material of the second conductivity type comprises:
    depositing a crystalline SiC overlayer of the second conductivity type on the first side of the SiC epitaxial layer and in the first trench; and
    planarizing the crystalline SiC overlayer.

4. The method of claim 3, wherein after planarizing the crystalline SiC overlayer and before forming the second trench, the method further comprises:
    forming a body region of the second conductivity type in the planarized crystalline SiC overlayer; and
    forming a source region of the first conductivity type and a body contact region of the second conductivity type above the body region.

5. The method of claim 4, wherein forming the second trench comprises:
etching the second trench through the planarized crystalline SiC overlayer and into the SiC epitaxial layer.

6. The method of claim 1, further comprising:
before forming the first trench, forming a body region of the second conductivity type in the SiC epitaxial layer.

7. The method of claim 6, further comprising:
after forming the first trench and before forming the second trench, forming a source region of the first conductivity type and a body contact region of the second conductivity type above the body region.

8. The method of claim 3, wherein after planarizing the crystalline SiC overlayer and before forming the second trench, the method further comprises:
forming a body region of the second conductivity type in the SiC epitaxial layer adjacent the first trench; and
forming a source region of the first conductivity type and a body contact region of the second conductivity type above the body region.

9. The method of claim 1, wherein forming the first trench comprises:
etching the first trench to the first depth in the SiC epitaxial layer;
filling a lower part of the first trench with an insulating material;
widening an upper part of the first trench which is devoid of the insulating material, so that the first trench has a step transition between the upper part and the lower part; and
after widening the upper part of the first trench, removing the insulating material from the lower part of the first trench.

10. The method of claim 9, wherein at least partly filling the first trench with the epitaxial material of the second conductivity type comprises:
after removing the insulating material from the lower part of the first trench, depositing a crystalline SiC overlayer of the second conductivity type on the first side of the SiC epitaxial layer and in the lower part and the supper part of the first trench; and
planarizing the crystalline SiC overlayer.

11. The method of claim 10, wherein forming the second trench comprises:
etching the second trench to the second depth which is below the step transition of the first trench.

12. A SiC device, comprising:
a first trench extending into a first side of a SiC epitaxial layer of a first conductivity type, the first trench terminating at a first depth in the SiC epitaxial layer;
an epitaxial material of a second conductivity type opposite the first conductivity type at least partly filling the first trench;
a second trench extending into the first side of the SiC epitaxial layer, the second trench overlapping the first trench, the second trench terminating at a second depth in the SiC epitaxial layer which is less than the first depth, and the epitaxial material in the first trench laterally extending below a bottom of the second trench; and
a gate electrode in the second trench and electrically insulated from the SiC epitaxial layer.

13. The SiC device of claim 12, wherein the epitaxial material in the first trench vertically extends along a lower part of a first sidewall of the second trench, and wherein a body region of the SiC device adjoins the epitaxial material at the first sidewall of the second trench or is formed in the epitaxial material.

14. The SiC device of claim 12, further comprising:
a body region adjacent the gate electrode; and
a source region above the body region and adjacent the gate electrode,
wherein the body region and the source region are electrically insulated from the gate electrode.

15. The SiC device of claim 12, wherein the first trench comprises a lower part and an upper part, wherein the upper part is wider than the lower part, wherein the epitaxial material of the second conductivity type is in the lower part and in the upper part of the first trench, and wherein the second trench terminates in the SiC epitaxial layer below a step transition between the lower part and the upper part of the first trench.

16. The SiC device of claim 12,
wherein the SiC device comprises a plurality of first trenches, a plurality of second trenches and a plurality of body regions of the second conductivity type,
wherein the plurality of first trenches and the plurality of body regions are arranged in rows of the first trenches, each row of the first trenches extending lengthwise in a first direction,
wherein the plurality of second trenches are arranged in rows of the second trenches, each row of the second trenches extending lengthwise in a second direction transverse to the first direction,
wherein in each row of the first trenches, the first trenches are spaced apart from one another by one of the body regions,
wherein the first trenches in adjacent rows of the first trenches are offset from one another so that a first trench in one row of the first trenches adjoins at least part of a body region of an adjacent row of the first trenches,
wherein the first trenches and the body regions are arranged alternatingly along the second direction.

17. The SiC device of claim 12, wherein part of the epitaxial material of the second conductivity type at least partly filling the first trench forms part of a superjunction structure.

18. The SiC device of claim 12, further comprising:
a body region of the second conductivity type adjacent the gate electrode;
a source region of the first conductivity type above the body region and adjacent the gate electrode; and
a body contact region of the second conductivity type above the body region and adjacent the source region,
wherein the body region extends through the body region to the epitaxial material of the second conductivity type.

19. The SiC device of claim 18, wherein the body contact region comprises:
a deeper, narrower part which contacts the epitaxial material of the second conductivity type; and
an upper, wider part which extends over the body region.

20. The SiC device of claim 12, wherein the epitaxial material of the second conductivity type comprises:
an upper section with a lower doping concentration; and
a lower section with a higher doping concentration.

* * * * *

UNITED STATES PATENT AND TRADEMARK OFFICE
CERTIFICATE OF CORRECTION

PATENT NO. : 10,580,878 B1
APPLICATION NO. : 16/105742
DATED : March 3, 2020
INVENTOR(S) : R. Joshi et al.

Page 1 of 1

It is certified that error appears in the above-identified patent and that said Letters Patent is hereby corrected as shown below:

In the Claims

Column 19, Line 41 (Claim 10, Line 7), please change "supper" to --upper--

Signed and Sealed this
Fifth Day of May, 2020

Andrei Iancu
*Director of the United States Patent and Trademark Office*